United States Patent
Benabdelaziz et al.

(10) Patent No.: US 8,461,845 B2
(45) Date of Patent: Jun. 11, 2013

(54) DETECTION OF THE STATE OF THE ELEMENTS OF AN ELECTRIC BRANCH COMPRISING A LOAD AND A SWITCH

(75) Inventors: Ghafour Benabdelaziz, Tours (FR); Pascal Paillet, Saint Cyr sur Loire (FR)

(73) Assignee: STMicroelectronics (Tours) SAS, Tours (FR)

( * ) Notice: Subject to any disclaimer, the term of this patent is extended or adjusted under 35 U.S.C. 154(b) by 864 days.

(21) Appl. No.: 12/383,324

(22) Filed: Mar. 23, 2009

(65) Prior Publication Data

US 2009/0261806 A1    Oct. 22, 2009

(30) Foreign Application Priority Data

Mar. 31, 2008  (FR) ...................................... 08 52085

(51) Int. Cl.
*G01R 31/02* (2006.01)
(52) U.S. Cl.
USPC ................. 324/415; 361/23; 361/87; 713/300
(58) Field of Classification Search
USPC .......................................................... 324/415
See application file for complete search history.

(56) References Cited

U.S. PATENT DOCUMENTS

| | | | | |
|---|---|---|---|---|
| 4,139,815 A * | 2/1979 | Mueller | ........................ | 324/620 |
| 4,142,493 A * | 3/1979 | Schira et al. | ............. | 123/568.21 |
| 4,369,403 A * | 1/1983 | Lee | ................. | 318/729 |
| 4,932,246 A * | 6/1990 | Deutsch et al. | ............ | 73/114.45 |
| 4,954,726 A * | 9/1990 | Lipman et al. | .................... | 307/46 |
| 5,173,867 A * | 12/1992 | Johnston et al. | .............. | 700/275 |
| 5,621,627 A * | 4/1997 | Krawchuk et al. | .............. | 363/37 |
| 5,831,807 A * | 11/1998 | Masannek et al. | ........... | 361/93.2 |
| 6,232,781 B1 * | 5/2001 | Goser et al. | .................... | 324/422 |
| 6,710,580 B2 * | 3/2004 | Shinba | ............................. | 322/37 |
| 7,039,821 B1 * | 5/2006 | Potega | ........................... | 713/340 |
| 7,127,623 B2 * | 10/2006 | Potega | ........................... | 713/300 |
| 7,355,826 B2 * | 4/2008 | Ochiai et al. | .................... | 361/23 |
| 2003/0202617 A1 * | 10/2003 | Casper | ......................... | 375/317 |
| 2004/0003169 A1 * | 1/2004 | Meit et al. | ..................... | 711/108 |
| 2006/0005055 A1 * | 1/2006 | Potega | ........................... | 713/300 |
| 2006/0043944 A1 * | 3/2006 | Moindron | ..................... | 323/234 |
| 2007/0090982 A1 * | 4/2007 | Sing et al. | ..................... | 341/153 |
| 2008/0143278 A1 * | 6/2008 | Zosel | ............................ | 315/403 |
| 2008/0181289 A1 * | 7/2008 | Moll | ............................... | 375/224 |
| 2008/0284253 A1 * | 11/2008 | Stenfert Kroese et al. | ... | 307/131 |
| 2009/0154042 A1 * | 6/2009 | Zisman | ........................... | 361/87 |
| 2011/0133743 A1 * | 6/2011 | Barton | ......................... | 324/415 |

* cited by examiner

*Primary Examiner* — Melissa Koval
*Assistant Examiner* — Benjamin M Baldridge
(74) *Attorney, Agent, or Firm* — The Noblitt Group, PLLC

(57) ABSTRACT

A method for detecting the state of at least one element of a circuit comprising one or several loads, powered by an A.C. voltage and in series with at least one first switch. The state of the element is obtained by analyzing, at several times in a period of the A.C. voltage, the amplitude of a current sampled from the junction point of the load and of the first switch.

17 Claims, 5 Drawing Sheets

DETECTION OF THE STATE OF THE ELEMENTS OF AN ELECTRIC BRANCH COMPRISING A LOAD AND A SWITCH

BACKGROUND OF THE INVENTION

1. Field of the Invention

The present invention generally relates to the detection of the state of a load powered by an A.C. power supply and, more specifically, to the monitoring of the state of this load and of one or several switches which control it.

The present invention more specifically applies to the detection of possible failures of the load and of the switch(es) in series with this load.

2. Discussion of the Related Art

Many circuits and methods for detecting the failure of a load have been provided. For example, US patent application No 2006/0043944 provides studying the voltage across the load and comparing it with thresholds. This circuit however does not enable distinguishing all the possible states of the circuit components (load and switches).

SUMMARY OF THE INVENTION

The present invention aims at overcoming all or part of the inadequacies of known techniques.

An embodiment of the present invention aims at enabling detection of all the possible states of the elements of a series load supply circuit.

An embodiment of the present invention aims at an alternative solution to the measurement of the voltage across the load.

An embodiment of the present invention aims at enabling detection of all the possible states of the elements of a circuit for supplying several loads in series or in parallel.

An embodiment of the present invention provides a method for detecting the state of at least one element of a circuit comprising one or several loads, powered by an A.C. voltage and in series with at least one first switch, the state of the element being obtained by analyzing, at several times in a period of the A.C. voltage, the amplitude of a current sampled from the junction point of the load and of the first switch.

According to an embodiment of the present invention, a first time corresponds to the maximum of the A.C. voltage, a second time corresponds to the A.C. voltage minimum, a third time is between the first time and the end of the positive halfwave of the A.C. voltage, and a fourth time is between the second time and the end of the negative halfwave of the A.C. voltage.

According to an embodiment of the present invention, the analysis comprises comparing, at each time, the amplitude of the current with at least one current threshold, forming a word of logic states from the result of the comparisons, and comparing this logic state word with words stored in a table.

According to an embodiment of the present invention, a first current threshold is defined during the positive halfwave of the A.C. voltage and a second current threshold is defined during the negative halfwave of the A.C. voltage.

According to an embodiment of the present invention, the method further enables determining the state of a second switch placed in series with the first switch and the load by analyzing, at least eight times per period of the A.C. voltage, the amplitude of the current sampled from the junction point of the load and of the first switch.

According to an embodiment of the present invention, the method further enables determining the state of at least one element of at least one second branch, parallel to a first branch comprising in series at least the load and at least the first switch, the second branch comprising at least a second load and at least a third switch, by analyzing, at several times in a period of the A.C. voltage, the amplitude of a current equal to the sum of the current sampled from the junction point of the first load and of the first switch and of a current sampled from the junction point of the second load and of the third switch.

An embodiment of the present invention also provides a circuit for detecting the state of at least one element of a circuit comprising one or several loads powered by an A.C. voltage in series with at least one first switch, the circuit comprising means for analyzing the amplitude of a current, sampled from the junction point of the load and of the first switch, at several times in a period of the A.C. voltage.

According to an embodiment of the present invention, the circuit further comprises at least one second switch in series with the load and the first switch, the state of which can be determined by the means for analyzing the amplitude of the current sampled from the junction point of the load and of the first switch, at least eight times per period of the A.C. voltage.

According to an embodiment of the present invention, the circuit comprises a second branch in electrical parallel with a first branch comprising at least the load and at least the first switch, the second branch comprising at least a second load and a third switch, the states of which can be determined by the circuit means for analyzing the amplitude of a current equal to the sum of the current sampled from the junction point of the first load and of the first switch and of a current sampled from the junction point of the second load and of the third switch.

The foregoing features of the present invention will be discussed in detail in the following non-limiting description of specific embodiments in connection with the accompanying drawings.

DETAILED DESCRIPTION

Figure 1:
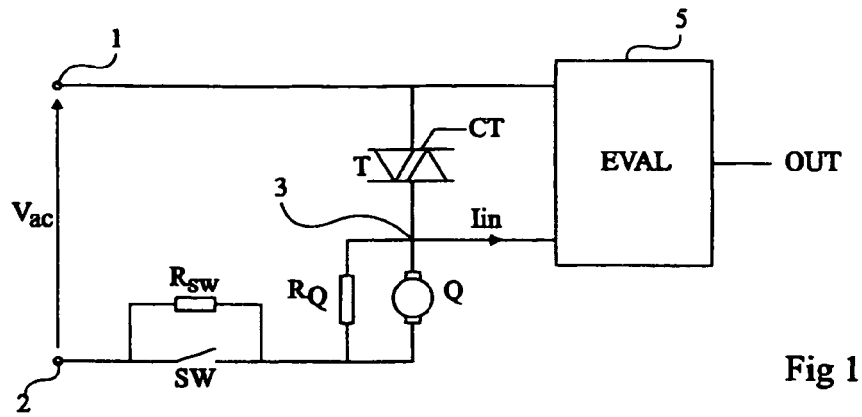
FIG. 1 illustrates a circuit for monitoring the state of a load according to an embodiment of the present invention.

The same elements have been designated with the same reference numerals in the different drawings.

For clarity, only those steps and elements which are useful to the understanding of the present invention have been shown and will be described. In particular, the nature of the load(s) present in the circuit will not be detailed, since any type of load can be monitored by a circuit according to an embodiment of the present invention, provided, if the protection element is placed in parallel with the load, that the load has a low impedance with respect to this protection element.

FIG. 1 illustrates a circuit for detecting the state of a load and of two switches which control it. This circuit comprises a load Q in series with two switches T and SW between two terminals 1 and 2 of application of an A.C. voltage Vac. Switch T is, for example, a triac controlled by a control signal CT of a programmer (not shown), for example, that of a washing machine. In the case of a washing machine, switch SW may symbolize a contact for detecting the opening of the machine door to interrupt the motor powering in case the door is opened (opening of the switch). A resistor $R_Q$, of a value greater than the impedance of load Q, is in parallel with the load. A resistor $R_{SW}$ of high value is in parallel with switch SW, resistance $R_{SW}$ being smaller than resistance $R_Q$. A window comparator 5 (EVAL) is placed between terminals 1 and 3 of triac T. It estimates a current Iin sampled from the junction point of load Q and of triac T and provides an output OUT which is, for example, at a high level when current Iin is in a given current window and at a low level otherwise. The detailed operation of the circuit of FIG. 1 will be described hereafter in relation with FIGS. 5A, 5B, 6A, 6B, 7A, and 7B.

Figure 2:
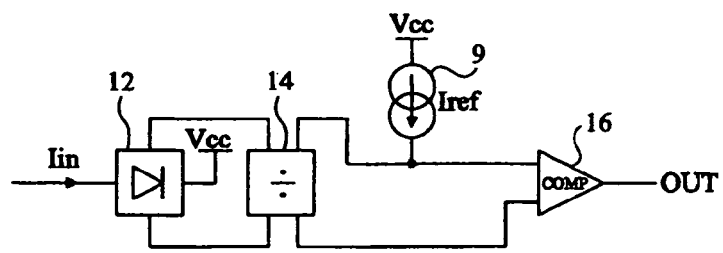
FIGS. 2 and 3 illustrate the structure and operation of a window comparator that can be integrated into the circuit of FIG. 1.

FIG. 2 is a block diagram illustrating the operation of a window comparator 5 that can be used in the circuit of FIG. 1.

Figure 3:
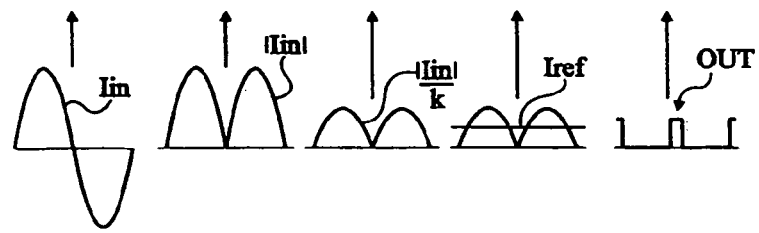

FIG. 3 illustrates the operation of the window comparator of FIG. 2 by showing examples of characteristic signal curves.

Referring now to FIGS. 1, 2, and 3, window comparator (EVAL) 5 compares A.C. input current Iin with a current window around the current zero defined by a current threshold Iref (current source 9). Current Iin is first rectified (block 12). This fullwave rectification is performed with respect to a D.C. voltage Vcc, which avoids the presence of a negative downstream voltage. Then, the rectified current |Iin| is divided by a value k (block 14). The result (|Iin|/k) is compared (block 16, COMP) with the constant D.C. reference current Iref. If the measured current is greater than current Iref, output OUT of the comparison function is at the low level. Otherwise, output OUT is at a non-zero level.

Figure 4:
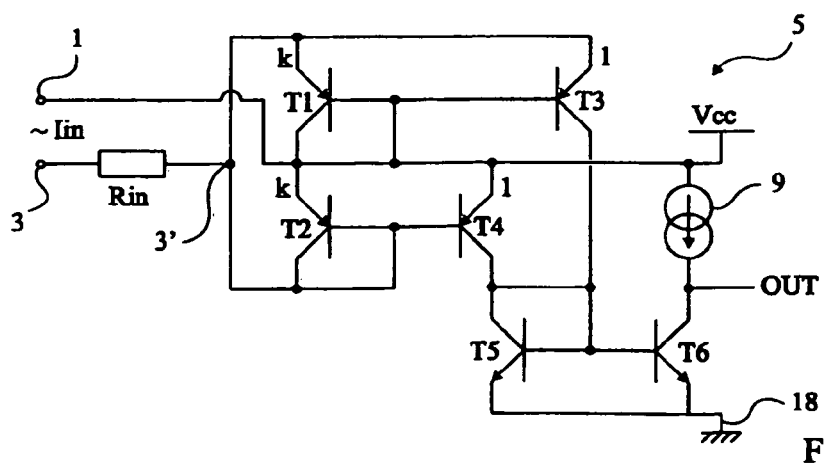
FIG. 4 illustrates an example of a window comparator circuit of the type described in FIGS. 2 and 3.

With continued reference to FIGS. 2 and 3, FIG. 4 illustrates an example of window comparator circuit 5 of FIG. 2, placed between two input terminals 1 and 3. Two PNP bipolar transistors T1 and T2 are each connected between a node 3' and terminal 1 corresponding to the terminal of application of a D.C. voltage Vcc. Node 3' is connected to input terminal 3 via a voltage-to-current conversion resistor Rin. Resistor Rin is of a high value and has the function of helping comparator 5 withstand the A.C. input voltage. The emitter of transistor T1 is connected to node 3' while the emitter of transistor T2 is connected to terminal 1. Transistor T1 is assembled as a diode and as a current mirror on a PNP transistor T3 having its emitter connected to node 3'. Transistor T2 is assembled as a diode and as a current mirror on a PNP transistor T4 having its emitter connected to terminal 1 and having its collector connected to the collector of transistor T3. The bases of transistors T1 and T3 are connected to the collector of transistor T1 (terminal 1). The bases of transistors T2 and T4 are connected to the collector of transistor T2. Transistors T1 and T2 insure the fullwave rectification function (12, FIG. 2). The current mirror of transistors T1 and T3 (respectively T2 and T4) behaves as a current divider 14 of ratio k, k being set by the ratio between the emitter surface areas of the transistors (k for transistors T1 and T2, 1 for transistors T3 and T4). A current mirror formed of two NPN-type transistors T5 and T6 is in charge of sampling, from source 9, a current proportional to the collector current of transistor T3 or T4, according to the halfwave of current Iin. Transistor T5 has its collector connected to its base and to the collectors of transistors T3 and T4 and its emitter connected to ground 18. Transistor T6 has its emitter connected to ground and has its collector connected to current source 9 at a common node defining output terminal OUT. The bases of transistors T5 and T6 are connected together and also to the collectors of transistors T3, T4, and T5. Transistor T6, mirror-assembled on transistor T5, subtracts from the current in transistor T3 or T4 the constant current Iref of source 9, which provides comparison function 16. When the measured current is greater than current Iref, output OUT is low (all of current Iref is absorbed by transistor T6). Otherwise, current source 9 provides a non-zero level on output OUT.

Current source 9 is for example formed by means of a resistor, of a transistor assembly known as a Widlar source, or of any other integrated current source. The value of current Iref will be selected in adapted fashion according to the desired current thresholds.

Window comparator 5 of FIG. 1 may be any other known window comparator operating according to the principle of FIG. 2 or similarly thereto.

Figure 5A:
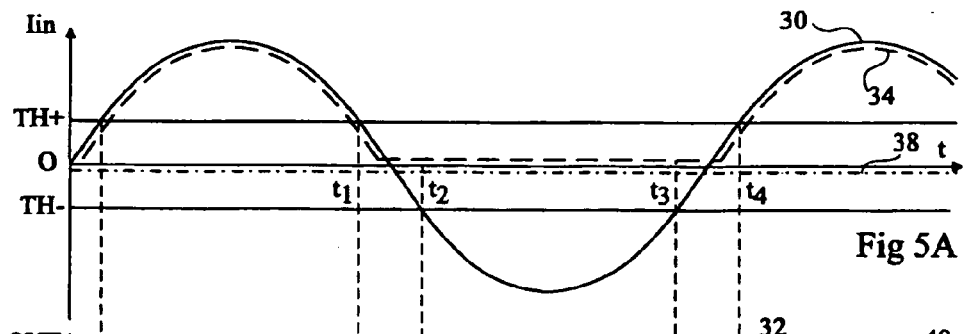
FIGS. 5A and 5B are timing diagrams illustrating a first example of the input current of the window comparator of the circuit of FIG. 1 and of the corresponding output signal.
Figure 5B:
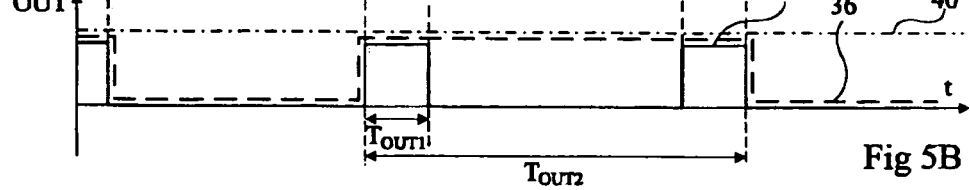
Figure 6A:
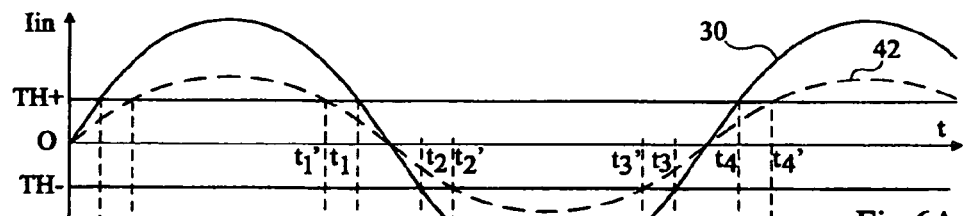
FIGS. 6A and 6B are timing diagrams illustrating a second example of the input current of the window comparator of the circuit of FIG. 1 and of the corresponding output signal.
Figure 6B:
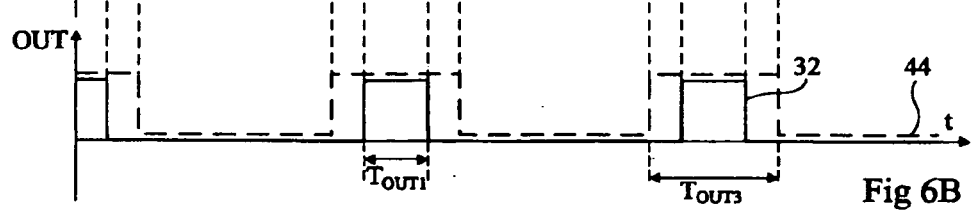
Figure 7A:
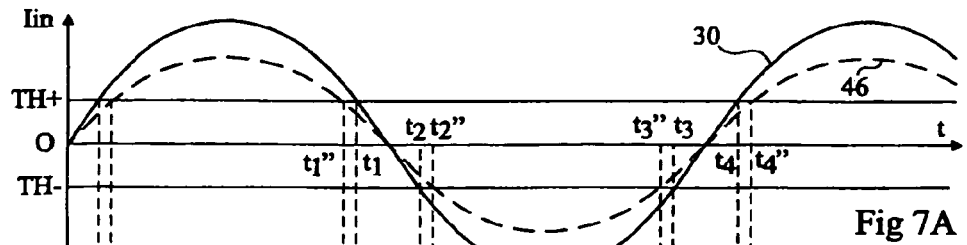
FIGS. 7A and 7B are timing diagrams illustrating a third example of the input current of the window comparator of the circuit of FIG. 1 and of the corresponding output signal.
Figure 7B:
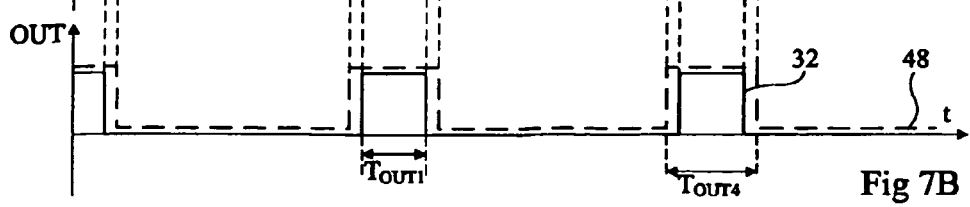

FIGS. 5A, 5B, 6A, 6B, 7A, and 7B illustrate the operation of the circuit of FIG. 1. FIGS. 5A and 5B respectively illustrate the current Iin and output OUT according to the different possible states of triac T. FIGS. 6A and 6B show curves of these same signals according to the different possible states of load Q, considering that triac T is off, and FIGS. 7A and 7B show the same according to the different possible states of switch SW, considering that triac T is off. In the timing diagrams showing the current Iin, thresholds TH− and TH+ are shown symmetrically with respect to the current zero. If the window comparator of FIG. 1 is that of FIGS. 2 and 3, the thresholds are equal to k×Iref. The values of thresholds TH+ and TH− will be selected by compromising between low values which allow detecting all possible states of the circuit of FIG. 1 and high values which enable a good detectability of the different states. Thresholds TH− and TH+ may have different values. For simplification, a purely resistive load Q is assumed.

FIGS. 5A and 5B illustrates the variation of current Iin and of output OUT according to the state of triac T, assuming that load Q operates properly and that switch SW is on. In the case where triac T is off across all halfwaves, current Iin is an A.C. current proportional to supply voltage Vac (curve 30 in full lines in FIG. 5A). The corresponding output OUT is illustrated in FIG. 5B by a curve 32 in full lines. At a time $t_1$, current Iin becomes lower than thresholds TH+, which causes the switching to the high state of output OUT. At a subsequent time $t_2$, current Iin becomes smaller than threshold TH−, which causes the switching to the low state of output OUT. The same occurs on output OUT during the next halfwave, between times $t_3$ and $t_4$.

In the case where triac T is off on one of the half-waves and is on on the other halfwave (diode mode), current Iin follows the curve 34 in dotted lines and output OUT follows curve 36 in dotted lines. During the first halfwave, curve 34 follows curve 30 and curve 36 follows curve 32. Then, between times $t_2$ and $t_4$, curve 34 remains at zero and output OUT is high. In the case where triac T is on during both halfwaves, current Iin is zero, as illustrated in FIG. 5A by a stripe-dot line 38, and output OUT remains high, as illustrated by stripe-dot line 40.

Call $T_{OUT}$ the time for which output OUT is high over a halfwave. When triac T is off, $T_{OUT}=T_{OUT1}=t_2-t_1$. When triac T is in diode mode, $T_{OUT}=T_{OUT2}=t_4-t_1>T_{OUT1}$. It is thus possible to determine the state of triac T according to time $T_{OUT}$. Comparing the current state of triac T with the control signal CT which is applied thereto enables determining a possible failure thereof.

FIGS. 6A and 6B illustrate the variations of current Iin and of output OUT according to the states of load Q, assuming that triac T is off and that switch SW is on. In the case where load Q operates properly, that is, where it is connected and has a low impedance, current Iin follows curve 30 and output OUT follows curve 32 (full lines), identical to those of FIGS. 5A and 5B.

In the case where load Q is defective, that is, where its impedance increases or where it is disconnected (resistor $R_Q$, of strong value, then ensures the junction between terminals 2 and 3), current Iin follows a curve in dotted lines 42 and the corresponding output OUT follows a curve in dotted lines 44. The impedance increase between terminals 2 and 3 (due to a load failure or disconnection), causes a decreases in current Iin. Thereby, the curve of current Iin cuts thresholds TH+ and TH– at times $t_1'$, $t_2'$, $t_3'$, and $t_4'$ different from times $t_1$, $t_2$, $t_3$, and $t_4$. A time period $T_{OUT3}=t_4'-t_3'$ longer than time period $T_{OUT1}$ is thus obtained. The length of time period $T_{OUT}$ thus enables determining the state of load Q.

FIGS. 7A and 7B illustrate the variations of output OUT according to the states of switch SW, assuming that triac T is off and that load Q operates properly.

In the case where switch SW is on, the obtained curves 30 and 32 in full lines are identical to those of FIGS. 5A and 5B. In the case where switch SW is off, resistor $R_{SW}$ ensures the junction between terminal 2 and load Q. Current Iin then follows a curve in dotted lines 46 proportional to curve 30 and output OUT follows a curve in dotted lines 48. Current Iin cuts thresholds TH+ and TH– at times $t_1''$, $t_2''$, $t_3''$, and $t_4''$ different from times $t_1$, $t_2$, $t_3$, and $t_4$. Further, resistance $R_{SW}$ being different from resistance $R_Q$, times $t_1''$, $t_2''$, $t_3''$, and $t_4''$ are also different from times $t_1'$, $t_2'$, $t_3'$, and $t_4'$. In the case where resistance $R_{SW}$ is smaller than resistance $R_Q$, a time period $T_{OUT4}$ longer than time period $T_{OUT1}$ and shorter than time period $T_{OUT3}$ is obtained.

The previously-described properties can be combined to obtain the state of the load and of the switches in series with the load. For this purpose, duration thresholds TH1, TH2, TH3, and TH4 to be compared with time period $T_{OUT}$ are defined. A time period $T_{OUT}$ shorter than the period of supply voltage Vac is here considered (triac not on over two consecutive halfwaves). Threshold TH1 is set to be lower than threshold TH2, threshold TH3 is set to be lower than threshold TH1, and threshold TH4 is set to range between thresholds TH1 and TH2. Thresholds TH1 and TH2 enable characterizing the state of load Q and of triac T. When time period $T_{OUT}$ is shorter than threshold TH1, triac T is off and load Q operates properly. When time period $T_{OUT}$ ranges between thresholds TH1 and TH2, triac T is off and load Q is defective or disconnected. When time period $T_{OUT}$ is longer than TH2, the triac is in diode mode. Thresholds TH3 and TH4 enable characterizing the state of switch SW. When time period $T_{OUT}$ is shorter than threshold TH3 or when it ranges between thresholds TH1 and TH4, switch SW is on. When time period $T_{OUT}$ ranges between thresholds TH3 and TH1 or TH4 and TH2, switch SW is off.

As a variation, resistance $R_{SW}$ may have a value greater than resistance $R_Q$. In this case, a time period $T_{OUT3}$ shorter than time period $T_{OUT4}$ is obtained, and thresholds TH1, TH2, TH3, and TH4 will be adapted accordingly.

Figure 8:
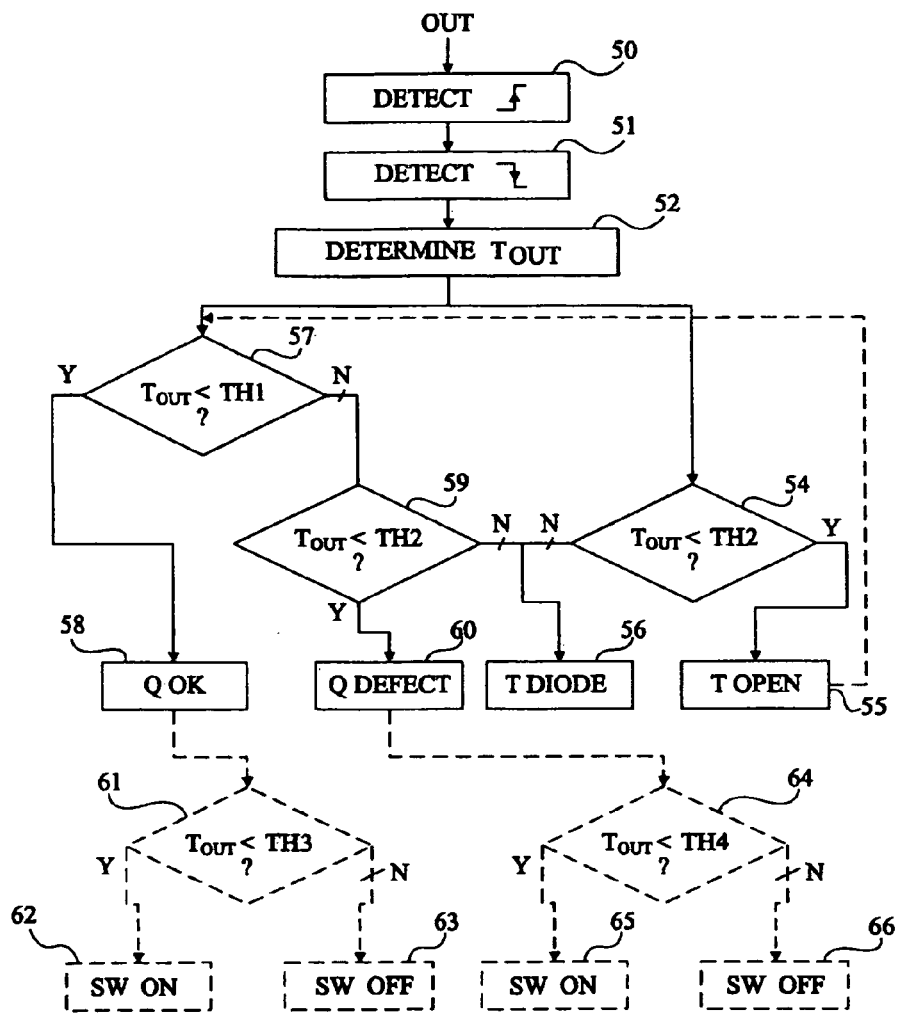
FIG. 8 is a flowchart illustrating a method for monitoring the state of a load according to an embodiment of the present invention.

FIG. 8 is a timing diagram flow chart illustrating a method for monitoring the state of a load and of at least one switch in series with the load.

A rising edge is first detected on output OUT of comparator 5 (block 50). Then, a falling edge is detected on output OUT (block 51). The time period $T_{OUT}$ for which output OUT has been in the high state is then determined (block 52).

Different tests are then performed according to the circuit element which is desired to be evaluated. To evaluate the state of triac T, time period $T_{OUT}$ is compared (block 54) with threshold TH2. If time period $T_{OUT}$ is shorter than threshold TH2 (block 55), this means that triac T is off (T OPEN) and the other circuit elements can then be tested. If not (block 56), the triac is in diode mode (T DIODE).

To evaluate load Q, time period $T_{OUT}$ is compared (block 57) with threshold TH1. If time period $T_{OUT}$ is shorter than threshold TH1 (block 58), this means that load Q is connected and operates properly (Q OK). If not, time period $T_{OUT}$ is compared (block 59) with threshold TH2. If time period $T_{OUT}$ is shorter than threshold TH2 (block 60), this means that load Q is defective or disconnected (Q DEFECT). If not, triac T is in diode mode (block 56).

Based on the above-described comparisons, the state of load Q and of triac T can be determined. In the case where a second switch SW is present in the circuit, the state of this switch can also be determined. The blocks necessary for this optional evaluation are shown in dotted lines in FIG. 8.

In the case where load Q operates properly (block 58), time period $T_{OUT}$ is compared with threshold TH3 (block 61). If time period $T_{OUT}$ is shorter than threshold TH3 (block 62), this means that switch SW is on (SW ON). If not (block 63), switch SW is off (SW OFF).

In the case where load Q is defective (block 60), time period $T_{OUT}$ is compared with threshold TH4 (block 64). If time period $T_{OUT}$ is shorter than threshold TH4 (block 65), this means that switch SW is on (SW ON). If not (block 66), switch SW is off (SW OFF).

The previously-described method thus enables determining the state of all the elements forming circuit of FIG. 1.

The steps of comparison of time period $T_{OUT}$ with thresholds TH1, TH2, TH3, and TH4 may be carried out in several ways, for example by means of a microprocessor. As a variation, the comparisons may be performed by means of a time counter connected on output OUT, having its output incremented when output OUT is in the high state, and of means for comparing the output level of this time comparator with thresholds.

Figure 9:
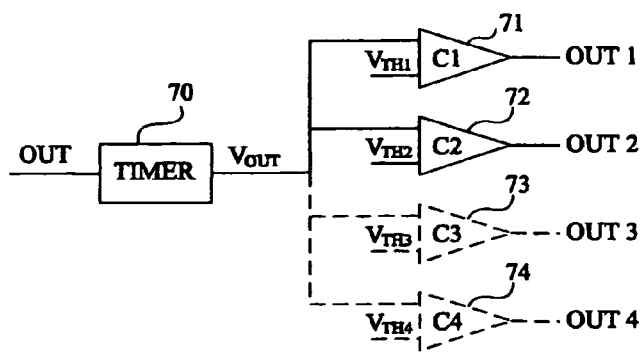
FIG. 9 is a block diagram of an embodiment of a system exploiting the signal provided by the circuit of FIG. 1.

FIG. 9 shows a system exploiting the signal provided by the circuit of FIG. 1. Output OUT of the circuit of FIG. 1 is connected to the input of a counter 70 (TIMER) having its output $V_{OUT}$ incremented when output OUT is high. Output $V_{OUT}$ is connected to four comparators 71 to 74 (C1 to C4), the second input of these comparators being set to voltage thresholds $V_{TH1}$, $V_{TH2}$, $V_{TH3}$, and $V_{TH4}$ which are determined according to the counter incrementation rate to correspond to thresholds TH1, TH2, TH3, and TH4. The state of outputs OUT1, OUT2, OUT3, and OUT4 of comparators 71 to 74 enables determining the state of the circuit of FIG. 1, in relation with the method of FIG. 8.

As a specific example, the application of the method to a circuit where $R_Q=1.2$ MΩ, $R_{SW}=620$ kΩ, Rin=200 kΩ, and where load Q has a 300-Ω impedance, in the case where triac T is off, provides time periods $T_{OUT}$ equal to:

480 μs if Q is operative and SW is on;
2.02 ms if Q is operative and SW is off;
3.46 ms if Q is defective and SW is on;
5.14 ms if Q is defective and SW is off.

In this case, thresholds TH1, TH2, TH3, and TH4 may respectively be set to 3 ms, 6 ms, 1 ms, and 4 ms.

In practice, if triac T is controlled to be turned off by control signal CT, it is checked (study of signal OUT) that it does not remain on or in diode mode. If the triac responds properly to the turn-off control, the signal OUT is examined to verify that load Q operates properly and that switch SW is on.

If triac T is controlled to be turned on, it is checked that it is not defective by verifying that signal OUT permanently is in the high state.

In practice, resistor Rin of window comparator circuit 5 of FIG. 1 may be an external resistor and the other elements of circuit 5, as well as triac T, may be integrated in the same circuit substrate.

FIGS. 10A to 10G are timing diagrams illustrating another method for monitoring the state of a load.

A circuit similar to the circuit of FIG. 1 is considered, which comprises, in series, a load Q and a switch T controlled by a control signal CT. Switch T may be a triac. A resistor $R_Q$ is placed in parallel with load Q and a window comparator, which measures a current Iin sampled from the junction point of load Q and of switch T, is placed in parallel with switch T.

Figure 10:
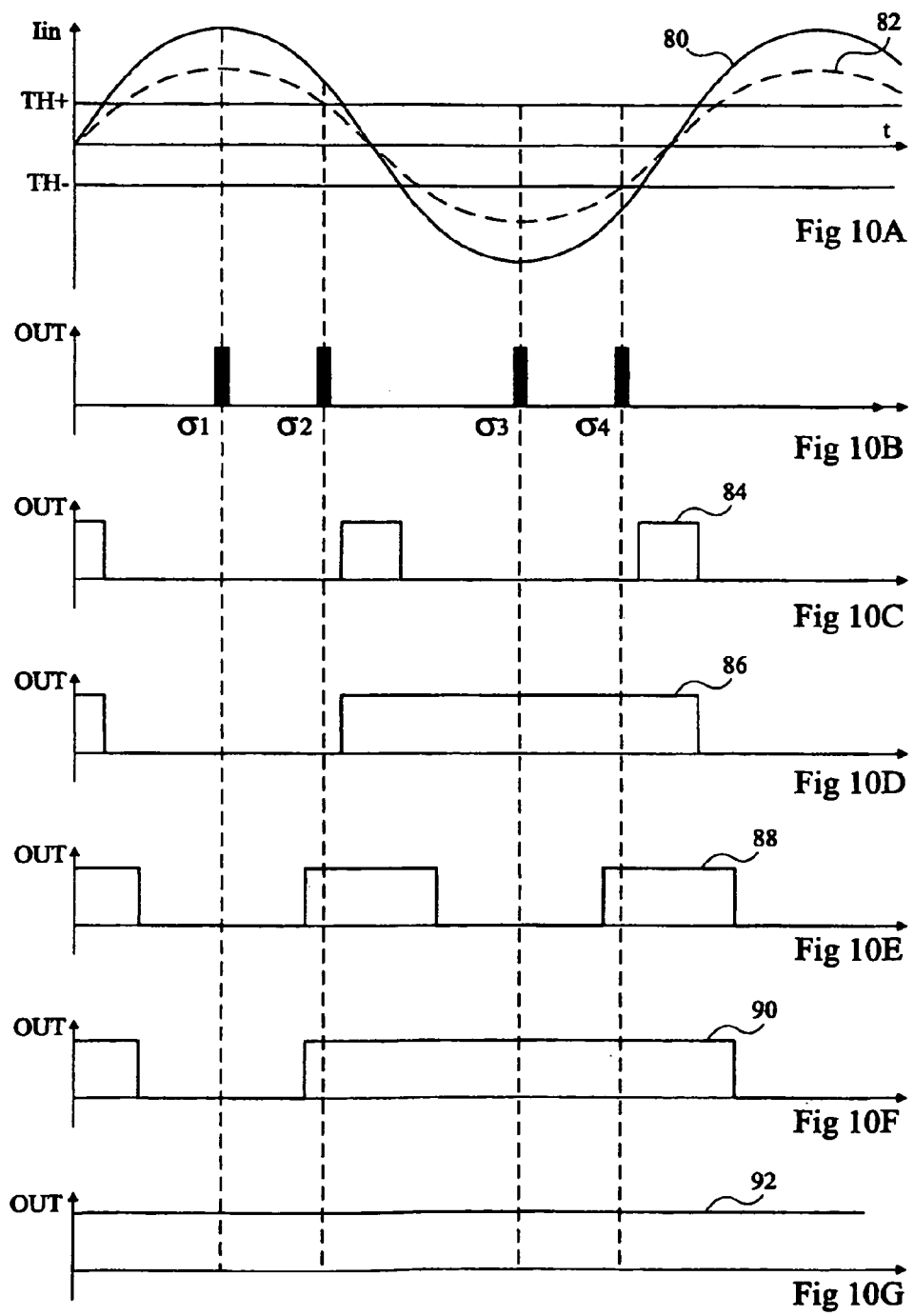
FIGS. 10A to 10G are timing diagrams illustrating a method for monitoring the state of a load according to another embodiment of the present invention.

FIG. 10A is a timing diagram illustrating the current Iin in two cases where switch T is off and where the state of load Q varies. Curve 80 illustrates the case where load Q operates properly and curve 82 illustrates the case where load Q is defective or disconnected.

The method comprises detecting the value of the signal on output OUT of the window comparator at selected times, which enables finding out the state of switch T and of load Q.

FIG. 10B is a timing diagram on which such times σ1, σ2, σ3, and σ4 are illustrated. In this example, time σ1 corresponds to the maximum of the A.C. power supply (Vac) and time σ3 corresponds to the minimum of this voltage. Time σ2 is between time σ1 and the end of the positive halfwave of the A.C. voltage, and time σ4 is between time σ3 and the end of the negative halfwave of the A.C. voltage. Times σ2 and σ4 are selected so that the signal on output OUT is, at these times, in one state when load Q operates properly and in another state when load Q is connected and defective or disconnected.

The timing diagrams of FIGS. 10C to 10G illustrate the signal on output OUT in several states of the circuit. FIG. 10C illustrates a curve 84 of the signal on output OUT when triac T is off and load Q operates properly. FIG. 10D illustrates a curve 86 of signal OUT when triac T is in diode mode and load Q operates properly. FIG. 10E shows a curve 88 of signal OUT when triac T is off and load Q is defective or disconnected. FIG. 10F illustrates a curve 90 of signal OUT when triac T is in diode mode and load Q is defective or disconnected. FIG. 10G illustrates a curve 92 of signal OUT when the triac is on.

The state of the signal on output OUT at times σ1, σ2, σ3, and σ4 is stored (high state, 1, or low state, 0). Then, these states are compared by logic state words to the following table which links the different possible states of load Q and of triac T with the corresponding levels of output OUT at times σ1, σ2, σ3, and σ4. In this table, control signal CT of switch T (level 1 if the switch is controlled to be turned on and level 0 if the switch is controlled to be turned off).

| CT | σ1 | σ2 | σ3 | σ4 | Triac | Load |
|---|---|---|---|---|---|---|
| 0 | 0 | 0 | 0 | 0 | Operative | Operative |
| 0 | 0 | 0 | 1 | 1 | Diode mode | Operative |
| 0 | 0 | 1 | 0 | 1 | Operative | Defective |

-continued

| CT | σ1 | σ2 | σ3 | σ4 | Triac | Load |
|---|---|---|---|---|---|---|
| 0 | 0 | 1 | 1 | 1 | Diode mode | Defective |
| 0 | 1 | 1 | 1 | 1 | Defective/on | Unknown state |
| 0 | 1 | 1 | 0 | 0 | Diode mode | Operative |
| 0 | 1 | 1 | 0 | 1 | Diode mode | Defective |
| 1 | 0 | 0 | 0 | 0 | Defective/off | Operative |
| 1 | 0 | 0 | 1 | 1 | Defective/diode | Operative |
| 1 | 0 | 1 | 0 | 0 | Defective/off | Defective |
| 1 | 0 | 1 | 1 | 1 | Defective/diode | Defective |
| 1 | 1 | 1 | 1 | 1 | Operative | Unknown state |
| 1 | 1 | 1 | 0 | 0 | Defective/diode | Operative |
| 1 | 1 | 1 | 0 | 1 | Defective/diode | Defective |

The state of switch T and of load Q is thus obtained according to control signal CT.

This detection method may also enable detecting the state of all the elements of a circuit such as that in FIG. 1 further comprising a switch SW. For this purpose, it is enough to set additional times during which the state of the signal on output OUT is detected. In the case of the circuit of FIG. 1, at least 8 adapted detection times must be provided to obtain the state of all the circuit elements (load Q, switches T and SW).

Figure 11:
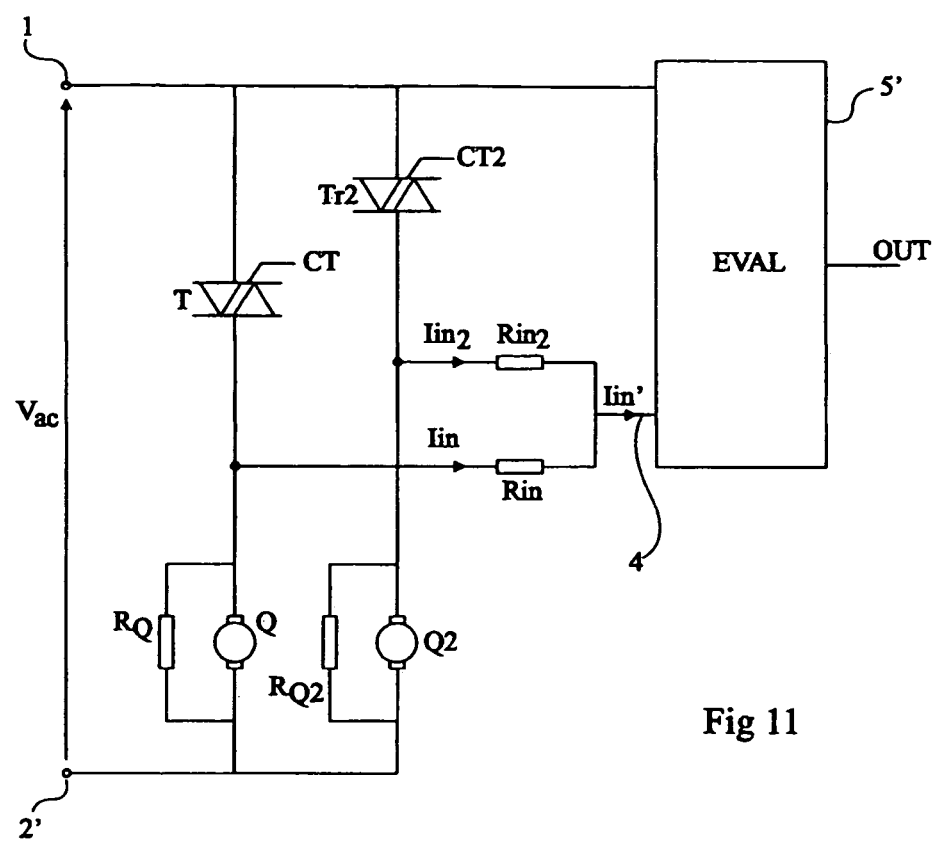
FIG. 11 illustrates a circuit for monitoring the state of two loads in parallel according to another embodiment of the present invention.

FIG. 11 illustrates another example of a circuit for monitoring the state of two loads in parallel.

This circuit comprises two branches in parallel placed between two terminals 1 and 2' of application of an A.C. supply voltage Vac. The first branch comprises, in series, a load Q and a triac T controlled by a control signal CT of a programmer (not shown). A resistor $R_Q$, of a value greater than the impedance of load Q, is placed in parallel with load Q. The second branch comprises a load Q2 in series with a triac Tr2 controlled by a control signal CT2 of a programmer (not shown). Resistor $R_{Q2}$, of a value greater than the impedance of load Q2, is placed in parallel with load Q2. A window comparator 5' (EVAL), of the same type as that shown in FIGS. 2 and 4 (except that resistor Rin is external in the case of comparator 5'), is placed between terminal 1 and a terminal 4. Terminal 4 is connected to the junction point of triac T and of load Q via a voltage-to-current conversion resistor Rin, the current flowing through this resistor being called Iin. Terminal 4 is also connected to the junction point of triac Tr2 and of load Q2 via a voltage-to-current conversion resistor $Rin_2$, the current flowing through this resistor being called $Iin_2$. Resistors Rin and $Rin_2$ have high values and have the function of helping window comparator 5' withstand A.C. input voltage Vac. The comparator evaluates sum Iin' of current Iin and $Iin_2$ and provides an output OUT which is, for example, at a high level when current Iin' is within a current window and at a low level otherwise. This current window will be adapted to the desired selection.

Thus, this circuit operates substantially in the same way as the circuit shown in FIG. 1. The different values of resistors Rin, $Rin_2$, $R_Q$, and $R_{Q2}$ enable shifting the switching times of the signal on output OUT when there is a change in the circuit state. When triac T is off and an element of the first branch is defective, current Iin varies, which reflects on current Iin' and thus on the switching times of the signal on output OUT. Similarly, when triac Tr2 is off and an element of the second branch is defective, current $Iin_2$ varies and the switching times of the signal on output OUT do the same.

By selecting thresholds TH− and TH+ adapted to these different variations, the state of each circuit element is detected, be it by the method described in relation with FIGS. 5 to 9 or with FIGS. 10A to 10G. If the detection method of FIGS. 10A to 10G is used, it is necessary to define enough times σ1, σ2, ... σn of detection of the signal state on output OUT to distinguish the different circuit states.

As a non-limiting example, the following resistance values may be selected: $R_Q=R_{Q2}=470$ kΩ, Rin=510 kΩ, and $Rin_2=240$ kΩ.

Specific embodiments of the present invention have been described. Various alterations, modifications, and improvements will readily occur to those skilled in the art. In particular, methods for monitoring one or several elements of a circuit formed of branches comprising a load in series with one or two switches have been described, but the present invention also applies to the detection of the state of one or of several elements of branches comprising more than two switches or several loads in series. In this case, resistors having different values are placed in parallel with the different elements to enable monitoring thereof.

It should also be understood by those skilled in the art that the method described in relation with FIG. 11 also applies to a circuit comprising more than two branches in parallel.

Further, the present invention applies whatever the type of load which is desired to be monitored, provided that it has, in normal operation, a relatively low impedance as compared with the resistor connected in parallel.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto. By way of example, the method described therein can be used in household and similar electrical appliances, for example an instantaneous type water heater, a motor compressor, a refrigerator, an ice-cream or ice maker, an electrical heat pump, an air conditioner, a dehumidifier, for example to meet the requirements of IEC/EN 60335-1 standard.

What is claimed is:

1. A method for detecting the state of at least one element of a circuit comprising:
    a load, powered by an A.C. voltage (Vac) and in series with a first switch, wherein the state of the element is obtained by analyzing the amplitude of a current (Iin) sampled from a junction point of the load and of the first switch, wherein the analysis comprises:
    comparing, at several times in a period of the A.C. voltage, the amplitude of the current (Iin) with at least one predetermined current threshold (TH−; TH+);
    forming a multi-bit word of logic states from the results of at least two of the comparisons;
    receiving in a lookup table the multi-bit word of logic states; and
    comparing the multi-bit word of logic states with multi-bit logic words stored in the lookup table, wherein at least one of the multi-bit logic words stored in the table is associated with a possible state of at least one element of the circuit.

2. The method of claim 1, wherein a first time corresponds to the maximum of the A.C. voltage (Vac), a second time corresponds to the A.C. voltage minimum, a third time is between the first time and the end of the positive halfwave of the A.C. voltage, and a fourth time is between the second time and the end of the negative halfwave of the A.C. voltage.

3. The method of claim 1, wherein a first current threshold is defined during the positive halfwave of the A.C. voltage (Vac) and a second current threshold is defined during the negative halfwave of the A.C. voltage.

4. The method of claim 1, further enabling determining the state of a second switch placed in series with the first switch and the load by performing the current comparison at least eight times per period of the A.C. voltage (Vac).

5. The method of claim 1, further enabling determining the state of at least one element of a second branch, parallel to a first branch comprising in series at least the load and at least the first switch, the second branch comprising at least a second load and at least a third switch, wherein the current comparison is performed on a current (Iin') equal to the sum of the current (Iin) sampled from the junction point of the first load and of the first switch and of a current ($Iin_2$) sampled from a junction point of the second load and of the third switch.

6. The method of claim 1, applied to monitor an electrodomestic device according to the IEC/EN 60335-1 standard.

7. A circuit for detecting the state of at least one element of a circuit having at least one load powered by an A.C. voltage (Vac) in series with at least one first switch, comprising:
    circuitry for analyzing the amplitude of a current (Iin) sampled from a junction point of the load and of the first switch, wherein the circuitry comprises:
    a comparison circuit configured to compare at several times in a period of the A.C. voltage, the amplitude of the current (Iin) with at least one predetermined current threshold (TH−; TH+); and
    a lookup table adapted to receive the several comparison results from the comparison circuit, and configured to generate a signal corresponding to the state of at least one element of the circuit according to the several comparison results.

8. The circuit of claim 7, further comprising:
    at least one second switch in series with the load (Q) and the first switch, wherein:
    the comparison circuit is configured to perform the current comparison at least eight times per period of the A.C. voltage (Vac); and
    the generated signal corresponds at least to the state of the second switch.

9. The circuit of claim 7, further comprising:
    A first branch comprising at least the load and at least the first switch; and
    a second branch comprising at least a second load and a third switch, wherein:
    the comparison circuit is configured to perform the current comparison on a current (Iin') equal to the sum of the current (Iin) sampled from the junction point of the first load and of the first switch and of a current ($Iin_2$) sampled from a junction point of the second load and of the third switch; and
    the generated signal corresponds at least to the state of an element of the second branch.

10. The circuit of claim 7, wherein the several times comprise:
    a first time corresponding to the maximum of the A.C. voltage (Vac);
    a second time corresponding to the A.C. voltage minimum;
    a third time between the first time and the end of the positive halfwave of the A.C. voltage; and
    a fourth time is between the second time and the end of the negative halfwave of the A.C. voltage.

11. The circuit of claim 10, wherein a first current threshold is defined during the positive halfwave of the A.C. voltage (Vac) and a second current threshold is defined during the negative halfwave of the A.C. voltage.

12. The circuit claim of claim 7, wherein the load comprises an electrodomestic device according to the IEC/EN 60335-1 standard.

13. A method for detecting the state of at least one element of a circuit comprising:
- a load, powered by an A.C. voltage (Vac) and in series with at least one first switch, wherein the state of the element is obtained by analyzing the amplitude of a current (Iin) sampled from a junction point of the load and of the first switch, wherein the analysis comprises:
- comparing, at several times in a period of the A.C. voltage, the amplitude of the current (Iin) with at least one predetermined current threshold (TH−; TH+);
- forming a multi-bit word of logic states from the results of the comparisons;
- receiving in a lookup table the multi-bit word of logic states; and
- comparing the multi-bit word of logic states with multi-bit logic words stored in the lookup table, wherein at least one of the multi-bit logic words stored in the lookup table is associated with a possible state of at least one element of the circuit, and
- wherein the several times in the period of the A.C. voltage only comprise:
- a first time corresponding to the maximum of the A.C. voltage;
- a second time corresponding to the A.C. voltage minimum;
- a third time corresponding to a time between the first time and the end of the positive halfwave of the A.C. voltage; and
- a fourth time corresponding to a time between the second time and the end of the negative halfwave of the A.C. voltage.

14. The method of claim 13, wherein a first current threshold is defined during the positive halfwave of the A.C. voltage (Vac) and a second current threshold is defined during the negative halfwave of the A.C. voltage.

15. The method of claim 13, further enabling determining the state of a second switch placed in series with the first switch and the load by performing the current comparison at least eight times per period of the A.C. voltage (Vac).

16. The method of claim 13, further enabling determining the state of at least one element of a second branch, parallel to a first branch comprising in series at least the load and at least the first switch, the second branch comprising at least a second load and at least a third switch, wherein the current comparison is performed on a current (Iin') equal to the sum of the current (Iin) sampled from the junction point of the first load and of the first switch and of a current ($Iin_2$) sampled from a junction point of the second load and of the third switch.

17. The method of claim 13, applied to monitor an electrodomestic device according to the IEC/EN 60335-1 standard.

* * * * *